United States Patent [19]

Suzuki

[11] Patent Number: 5,424,562
[45] Date of Patent: Jun. 13, 1995

[54] LATERAL STATIC INDUCTION TRANSISTOR

[75] Inventor: Mutsumi Suzuki, Kanagawa, Japan

[73] Assignee: Nikon Corporation, Tokyo, Japan

[21] Appl. No.: 327,847

[22] Filed: Oct. 24, 1994

Related U.S. Application Data

[63] Continuation of Ser. No. 138,879, Oct. 18, 1993, abandoned, which is a continuation of Ser. No. 8,099, Jan. 22, 1993, abandoned, which is a continuation of Ser. No. 770,981, Oct. 1, 1991, abandoned.,

[30] Foreign Application Priority Data

Oct. 1, 1990 [JP] Japan ................................. 2-260535

[51] Int. Cl.⁶ ............................................. H01L 29/80
[52] U.S. Cl. ...................................... 257/136; 257/268; 257/274; 257/291; 257/345; 257/375; 257/549
[58] Field of Search ............... 357/23.14, 42; 257/136, 257/375, 69, 345, 268, 274, 291, 549

[56] References Cited

U.S. PATENT DOCUMENTS 4,660,062 4/1987 Nishizawa et al. ................. 257/345
5,023,190 6/1991 Lee et al. ............................. 357/42

Primary Examiner—Edward Wojciechowicz
Attorney, Agent, or Firm—Michael N. Meller

[57] ABSTRACT

A lateral static induction transistor suited for use as a picture element of a solid state imaging device. The lateral static induction transistor includes a semiconductor substrate of a first conduction type of P type or N type, a first epitaxial layer of the same conduction type as the first conduction type which is formed on the semiconductor substrate, a second epitaxial layer of a second conduction type opposite to the first conduction type which is formed on the first epitaxial layer, a source zone and a plurality of drain zones which are formed in the second epitaxial layer near the surface thereof, and a plurality of gates each thereof being formed so as to partially lie over the source zone and one of the drain zones on the second epitaxial layer through an insulating layer.

6 Claims, 3 Drawing Sheets

LATERAL STATIC INDUCTION TRANSISTOR

This application is a continuation of application Ser. No. 08/138,879, filed Oct. 18, 1993, now abandoned, which is a continuation of application Ser. No. 08/008,099, filed Jan. 22, 1993, now abandoned, which is a continuation of application Ser. No. 07/770,981 filed Oct. 1, 1991, now abandoned.

BACKGROUND OF THE INVENTION

1. Field of the Invention

The present invention relates to a semiconductor device and more particularly to a lateral static induction transistor used as a picture element of a solid state imaging device.

2. Description of the Prior Art

The basic construction of a conventional lateral static induction transistor (hereinafter simply referred to as an LSIT by using their first letters) is such that deposited by the addition of an impurity on a P-type (or N-type) semiconductor substrate, for example, is an N− (or P− if the substrate is N type) epitaxial layer formed opposite in conduction type to the semiconductor substrate, that N+ source and N+ drain zones are formed in the portions of the N− epitaxial layer near the surface thereof and that gate electrodes are formed through an insulating layer such as a silicon oxide layer on the N− epitaxial layer so as to respectively lie partially over the source zone and one of the drain zones. Then, the individual transistor elements are isolated electrically from one another by isolation zones formed in the epitaxial layer.

The fabrication of the LSIT constructed as described above is effected by first growing an N− epitaxial layer on a P-type semiconductor substrate, for example, and then performing such heat treatments as oxidation and diffusion so as to form source, drain and gate zones and an insulating layer.

Then, the channel of the LSIT is formed by the epitaxial layer of the opposite conduction type grown on the semiconductor substrate and it is known that small variations in the impurity concentration and thickness of the epitaxial layer have a great effect on the electric characteristics of the LSIT. For instance, if the N− epitaxial layer is high in impurity concentration or thickness, the LSIT has a normally -on characteristic (there is the flow of current between the source and the drain without the application of a voltage between the gate and the source. On the contrary, if the N− epitaxial layer is low in impurity concentration or thickness, the LSIT comes close to the normally-off characteristic (no current flows between the source and the drain unless a voltage is applied between the gate and the source).

Thus, in the case of the conventional LSIT such as mentioned above, due to the fact that the electric characteristics of the element are susceptible to the effect of variations in the physical properties of the epitaxial layer forming the channel, the problems which will be described hereunder are encountered in cases where a plurality of LSITs must be fabricated so as to be arranged one-dimensionally or two-dimentionally on the common semiconductor substrate, that is, where these LSITs are used for the picture elements of a solid state imaging device.

In other words, the semiconductor substrate generally involves impurity concentration variations, which are called as a striation, in small areas. If such impurity concentration variations are present in the semiconductor substrate, due to the heat treatments by the operations following the growing of the epitaxitial layer, the redistribution of the impurity concentration is caused at the boundary surface between the semiconductor substrate and the epitaxial layer and microscopically the thickness of the epitaxial layer varies from one small area to another. Where a plurality of LSITs are fabricated on the common semiconductor substrate, such thickness variations lead directly to variations in electric characteristics among the individual LSITs and therefore variations in electric characteristics are caused among the individual LSITs depending on their location on the substrate.

Thus, where the conventional LSITs are applied to the respective picture elements of a solid state imaging device, due to the variations in LSIT electric characteristics caused by the variations in impurity concentration among the different small areas of the semiconductor substrate, the solid state imaging device is caused to produce a large FPN (fixed pattern noise).

SUMMARY OF THE INVENTION

Therefore, it is an object of the present invention to provide an improved construction of LSITs which overcomes the foregoing deficiencies in the prior art and which ensures uniform electric characteristics among the different locations of the semiconductor substrate used despite its impurity concentration variations such as striation.

In accordance with the basic concept of the present invention which is intended to overcome the foregoing deficiencies, a lateral static induction transistor includes a semiconductor substrate of a first conduction type of P type or N type, a first epitaxial layer of the same conduction type as the first conduction type formed on the semiconductor substrate, a second epitaxial layer of a second conduction type opposite to the first conduction type formed on the first epitaxial layer, source and drain zones formed in the second epitaxial layer in the vicinity of the surface thereof, and a plurality of gates each formed so as to partially lie over the corresponding source and drain zones on the second epitaxial layer through an insulating layer.

In accordance with the LSIT of the present invention, due to the fact that the first epitaxial layer of the same conduction type as the semiconductor substrate is interposed between the semiconductor substrate and the second epitaxial layer of the opposite conduction type forming the channel of the LSIT, even if the heat treatments for the formation of the insulating layer, etc., are performed after the formation of the second epitaxial layer during the manufacturing operations of the LSIT, the first epitaxial layer of the same conduction type as the semiconductor substrate serves the role as a buffer zone and there is no danger of the variations in the impurity concentration of the semiconductor substrate causing variations in the thickness of the second epitaxial layer forming the channel. In other words, in accordance with the present invention the electric characteristics of the plurality of LSITs formed on the semiconductor substrate can be made uniform irrespective of the variations in the impurity concentration of the semiconductor substrate.

Also, while the LSITs are such that it is required to set the impurity concentration of the substrate to a low value in conformity to the epitaxial layer forming the channel thereby reducing the variations in electric characteristics among the individual elements, in accordance with the present invention the second epitaxial layer serving as the channel is formed on the semiconductor substrate through the first epitaxial layer of the same conduction type as the semiconductor substrate and therefore there is no need to greatly reduce the impurity concentration of the semiconductor substrate itself. As a result, while it has heretofore been necessary to use the semiconductor substrate fabricated by the FZ method (the floating zone method) as the substrate for the LSITs so as to ensure the reduced impurity concentration, in accordance with the present invention the semiconductor substrate fabricated according to the CZ method (the Czochralski method) and having some advantages can be used to fabricate the LSITs. In other words, the semiconductor substrate fabricated by the CZ method is high in oxygen concentration and high in substrate rigidity as compared with the semiconductor substrate fabricated by the FZ method and thus there is the advantage that there is less tendency to cause deformation of the semiconductor substrate due to the high temperature heat treatments. Since the present invention can choose the semiconductor substrate according to the CZ method to reduce the deformation of the substrate, it is easy to prevent the occurrence of deformation of the substrate during the lithographic and etching operations and there is provided a construction which is extremely advantageous in such fields of utilization where particularly a large number of LSITs are formed, along with other electronic elements such as CMOS transistors on the same substrate, e.g., a solid-state imaging device.

The above and other features of the present invention will become more apparent from the following description of nonlimiting nature taken in conjunction with the accompanying drawings.

DESCRIPTION OF THE PREFERRED EMBODIMENTS

Figure 4:
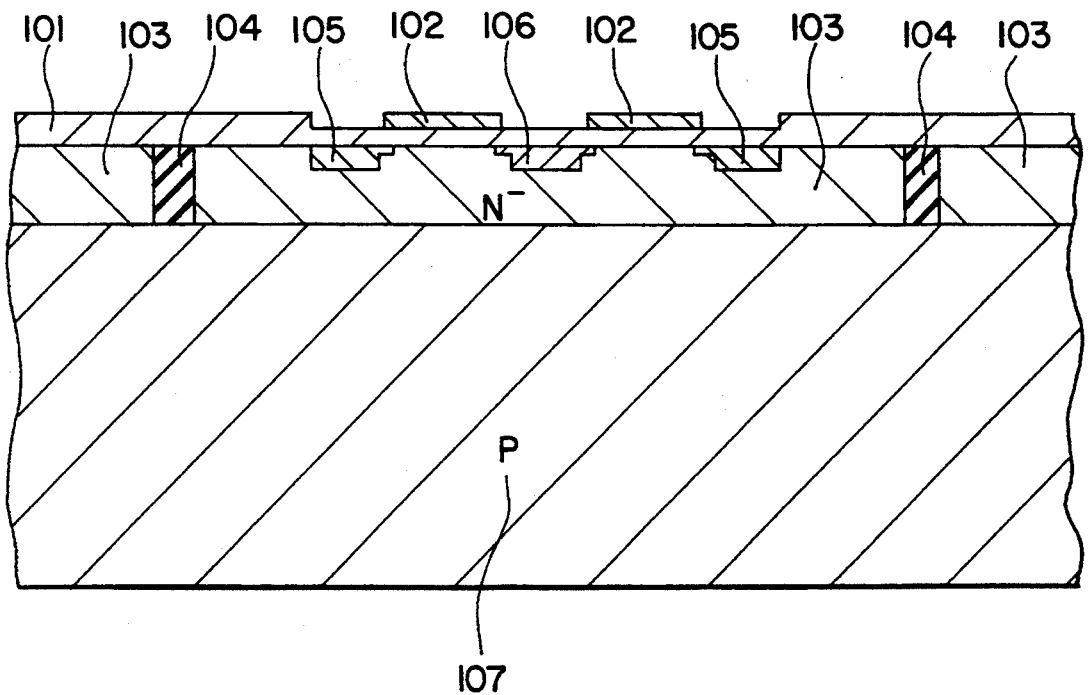
FIG. 4 is a sectional view showing by way of example the basic construction of a conventional lateral static induction transistor.

Before describing an embodiment of the present invention, the basic construction of a conventional LSIT will be described with reference to FIG. 4. In FIG. 4, deposited by the addition of an impurity on a P-type (or N-type) semiconductor substrate 107 is an N− (or P− if the substrate is the N type) epitaxial layer 103 of the opposite conduction type to the semiconductor substrate 107, and the respective zones of N+ source 106 and N+ drains 105 are formed in the N− epitaxial layer 103 near the surface thereof. Also, gates 102 are each formed on the N− epitaxial layer 103 through an insulating layer 101 composed for example of a silicon oxide layer so as to lie over the corresponding source 106 and darin 105 in a partially overlapping manner. Then, the individual transistor elements are separated from one another by isolation zones 104 formed in the epitaxial layer 103 and the epitaxial layer 103 forms the channel for the passage of current.

With the construction described above, the fabrication of the LSIT is effected by first growing the N− epitaxial layer 103 on the P-type semiconductor substrate 107 and then performing such heat treatments as oxidation and diffusion so as to form the various zones including the source 106, the drains 105 and the gates 102 and the insulating layer 101.

Then, in the case of the LSIT shown in FIG. 4, its channel is composed of the N− epitaxial layer 103 and the impurity concentration and/or the thickness of the N− epitaxial layer 103 has a great effect on the electric characteristics of the LSIT. For instance, if the impurity concentration of the N− epitaxial layer 103 is high or its thickness is large, the LSIT has a normally-on characteristic (current flows between the source 106 and the drain 105 without the application of any voltage between the gate 102 and the source 106). On the contrary, if the N− epitaxial layer 103 is low in impurity concentration or small in thickness, its characteristic comes close to a normally-off one (no current flows between the source 106 and the drain 105 unless a voltage is applied between the gate 102 and the source 106).

Figure 3:
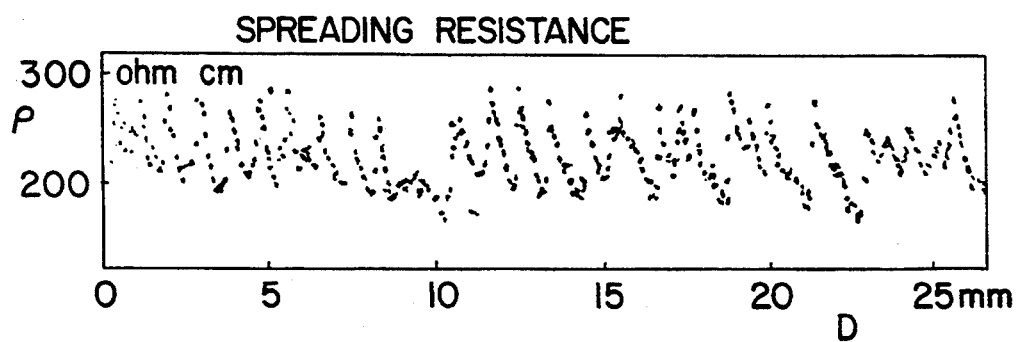
FIG. 3 is a graph showing an impurity concentration distribution of a semiconductor substrate.

FIG. 3 is a graph showing an impurity concentration distribution of the semiconductor substrate. The abscissa represents the distance [mm] to a radial position D on the semiconductor substrate from its center consisting of the origin and the ordinate represents the specific resistance $\rho[\Psi\cdot cm]$ (the value of the specific resistance decreases with increase in the impurity concentration and the value of the specific resistance increases with decrease in the concentration). As shown in FIG. 3, generally there exist the variations in impurity concentration, called as a striation among the small areas. As mentioned previously, if there are such impurity concentration variations in the semiconductor substrate, the redistribution of the impurity concentration is caused at the boundary surface between the semiconductor substrate and the epitaxial layer due to the heat treatments by the operations following the growing of the epitaxial layer and microscopically the thickness of the epitaxial layer varies from one small area to another. Where a plurality of LSITs are simultaneously formed on the common semiconductor substrate, this directly leads to the occurrence of variations in electric characteristics among the different LSITs and consequently the electric characteristics of the individual LSITs differ from one another depending on their locations on the semiconductor substrate.

Figure 1:
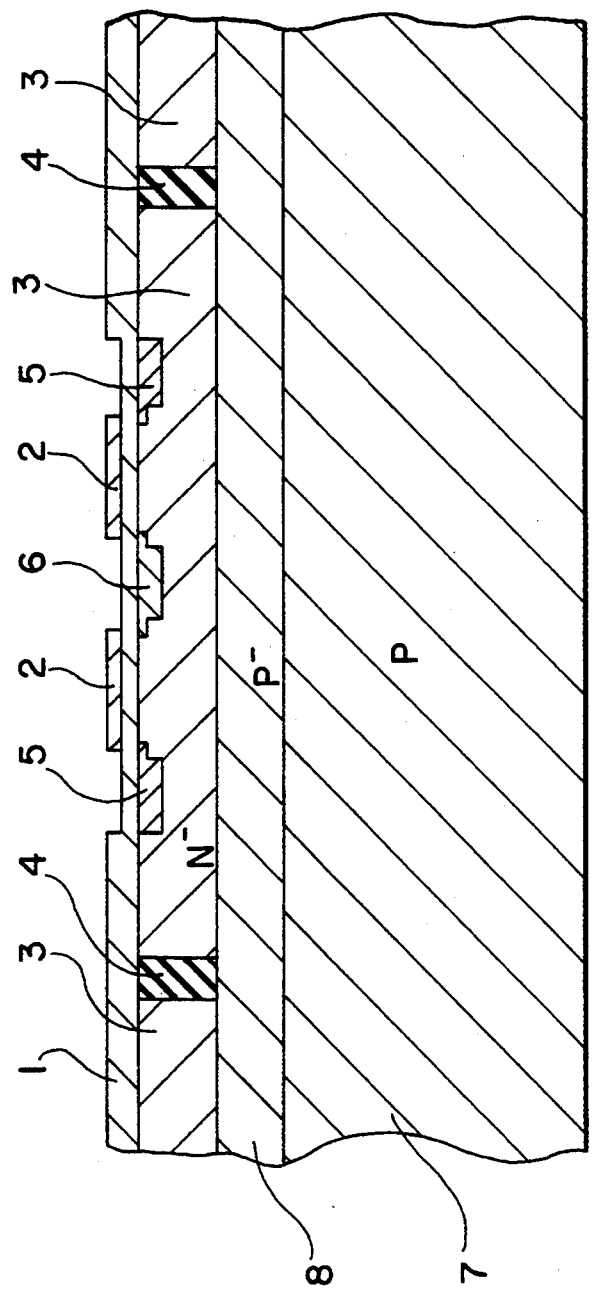
FIG. 1 is a sectional view of the basic construction of an embodiment of a lateral static induction transistor according to the present invention.

FIG. 1 shows the basic construction of an LSIT according to an embodiment of the present invention. In this embodiment, instead of directly forming an epitaxial layer of the opposite conduction type on a semiconductor substrate, as shown in the Figure, formed on a semiconductor substrate 7 (P type in this case) is a first epitaxial layer 8 of the same conduction type (P− in the illustrated case), and a second epitaxial layer 3 of the opposite conduction type (N− in the illustrated case) is formed on the first epitaxial layer 8. Then, various zones including source 6 and drains 5 are formed in the second epitaxial layer 3 near the surface thereof in the like manner as previously mentioned and on these zones are further formed transparent gate electrodes 2 made of $SnO_2$ or ITO through an insulating layer 1 composed of a silicon oxide layer. In addition, the adjacent elements are electrically separated from one another by isolation zones 4 composed of insulating materials, P+ diffused zones or the like.

With the LSIT of the present invention constructed as above described, the first epitaxial layer 8 interposed between the semiconductor substrate 7 and the second epitaxial layer 3 serves the role as a buffer zone. In other words, the epitaxial layers 3 and 8 each produced by growing a single crystal layer along the crystallographic axis of the substrate are remarkably uniform in impurity concentration as compared with the semiconductor substrate 7 itself and thus the redistribution of the impurity concentration is caused at the boundary surface between the semiconductor substrate 7 and the first epitaxial layer 8 in accordance with the variations in the impurity concentration of the semiconductor substrate 7; however, no such variations of the impurity concentration distribution are caused at the boundary surface between the epitaxial layers 3 and 8. As a result, while the effective thickness of the second epitaxial layer 3 may be varied on the whole during the heat treatments due to the ratio between the impurity concentrations of the epitaxial layers 3 and 8, any thickness variations depending on the location are not caused and no variations in electric characteristics are caused among the small areas.

Figure 2:
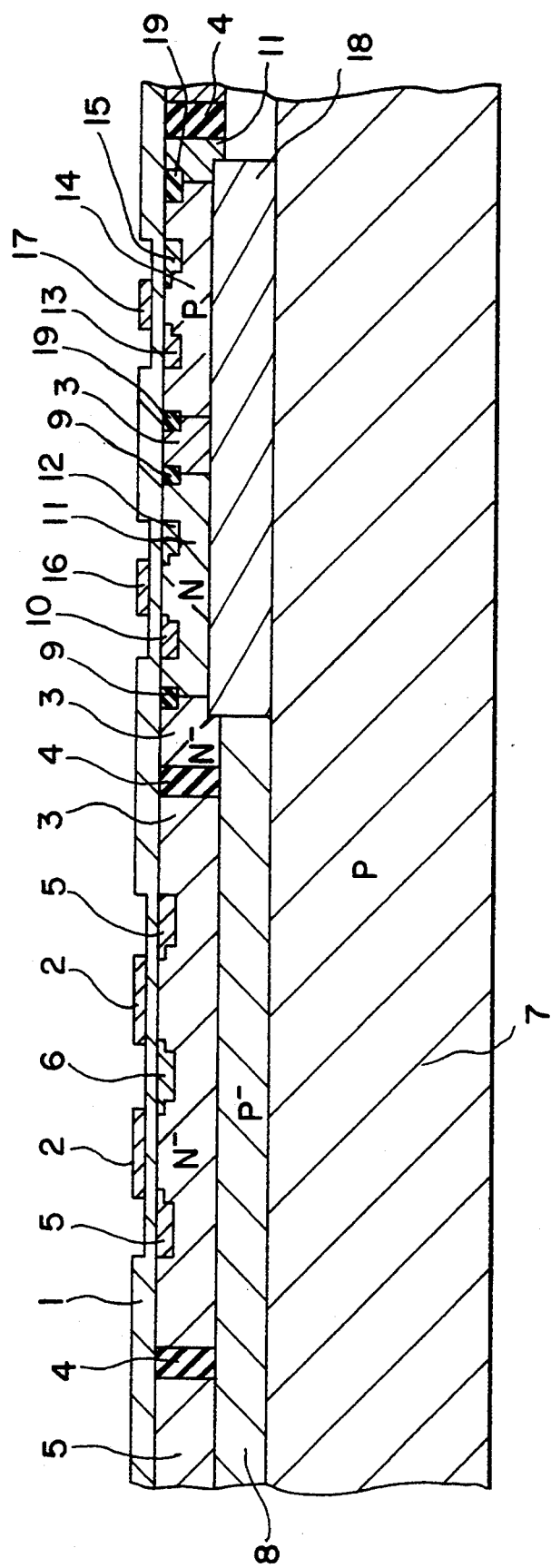
FIG. 2 is a sectional view showing the construction of another embodiment according to the present invention.

FIG. 2 is a sectional view showing the construction of an LSIT according to another embodiment of the present invention and in this embodiment LSITs and CMOSs are fabricated adjacent to one another on the same substrate.

In FIG. 2, numeral 7 designates a P-type silicon substrate (semiconductor substrate of an impurity concentration $1 \times 10^{15}$ cm$^{-3}$ produced according to the CZ (Czochralski method). Numeral 8 designates a P$^-$ epitaxial layer (a first epitaxial layer) having an impurity concentration of $2 \sim 5 \times 10^{13}$ cm$^{-3}$ and a thickness of $5 \sim 10$ μm and it functions as a buffer zone which prevents the effect of the impurity concentration variations of the P-type Si substrate 7 as mentioned previously.

In FIG. 2, the left-side half with respect to the middle portion of the Figure is the LSIT portion of substantially the same construction as the LSIT described in connection with FIG. 1 and the reference numerals of the corresponding component parts are the same as in FIG. 1. The right-side half with respect to the middle portion of the Figure is the CMOS portion so that in the portion forming the CMOS portion an N-type buried layer 18 is built in the P$^-$ epitaxial layer 8. This N-type buried layer 18 has its impurity concentration selected in such a manner that the peak concentration becomes $10^{15} \sim 10^{17}$ cm$^{-3}$ at the time that the final heat treatment is performed and the N-type buried layer 18 serves the role of an electric isolation between a P well zone 14 and the P-type Si substrate 7.

Formed on the P$^-$ epitaxial layer 8 and the N-type buried layer 18 is an N$^-$ epitaxial layer (a second epitaxial layer) 3 having a concentration of $2 \sim 5 \times 10^{13}$ cm$^{-3}$ and a thickness of $5 \sim 10$ μm. This N$^-$ epitaxial layer 3 has the role of serving as the channel of the LSIT so that N+ drain zones 5 and an N+ source zone 6 are formed in the N$^-$ epitaxial layer 3 near the surface thereof in the left-side half with respect to the middle of FIG. 2. Also, each LSIT portion forms one picture element and each CMOS portion forms its peripheral circuit element such as a switching and the boundary between the respective LSIT and CMOS element zones is provided by an isolation zone 4 which is composed of a P+ diffused zone formed in the epitaxial layer 3 so as to electrically isolate the two elements.

In the CMOS portion shown in the right-side portion with respect to the middle of FIG. 2, formed on the N-type buried layer 18 are an N well zone 11 where a PMOS-FET of the CMOS is formed and the P well zone 14 where an NMOS-FET is formed. The impurity concentrations of the well zones 11 and 14 are selected so as to optimize the characteristics of the CMOS. A drain zone 12 and a source zone 10 of the PMOS-FET are formed in the N well zone 11, and a drain zone 13 as well as a source zone 15 of the PMOS-FET are formed in the P well zone. Numerals 9 and 19 designate an N+ channel stop and P+ channel stops, respectively.

An insulating layer 1 made of SiO$_2$ is formed so as to cover the above-mentioned whole area, and formed on the insulating layer 1 are DOPOS gates 2 of the LSIT, a DOPOS gate 16 of the PMOS-FET and a DOPOS gate 17 of the NMOS-FET.

The manufacturing steps of the semiconductor elements shown in FIG. 2 will be described briefly as follows.

Firstly, the P$^-$ epitaxial layer 8 is formed on the P-type Si substrate 7 and then the N-type buried layer 18 is formed. Then, the epitaxial growth of the N$^-$ epitaxial layer 3 is effected and then the P+ isolation zones 4, the N well zone 11 and the P well zone 14 are formed. Then, the various zones of the respective transistors, i.e., the sources 6, 12 and 15, the drains 5, 10 and 13 and the gates 2, 16 and 17 are formed thereby completing the semiconductor elements.

In the course of these manufacturing steps, the heat treatment effected at the highest temperature for the longest period of time after the epitaxial growth is the well diffusion step which forms the P+ isolation zones 4, the N well zone 11 and the P well zone 14. The specific conditions of this well diffusion step are generally 1150° C. and 20 hours.

In this case, if variations in the impurity concentration, which are called as a striation, are present in the P-type Si substrate 7 as shown in FIG. 3, the thickness of the P$^-$ epitaxial layer 8 varies in its small areas on the Si substrate 7 side in accordance with the variations in the impurity concentration of the P-type Si substrate 7. However, the impurity concentration in the vicinity of the boundary surface between the P$^-$ epitaxial layer 8 and the N$^-$ epitaxial layer 3. In other words, since the P$^-$ epitaxial layer 8 functions as a buffer zone, the variations in the impurity concentration of the Si substrate 7 have no effect on the thickness of the N$^-$ epitaxial layer 3 serving as the LSIT channel and thus the electric characteristics of the LSITs become uniform irrespective of their location on the substrate. Also, in accordance with the present embodiment the concentration of the impurity in the P$^-$ epitaxial layer 8 is adjusted to the same level as that of the N$^-$ epitaxial layer 3 so that the variation in the effective thickness of the N$^-$ epitaxial layer 3 on the whole due to the heat treatment is reduced and no variation is caused in the electric characteristics.

By using the semiconductor elements of FIG. 2 as the picture elements of a solid state imaging device, it is possible to reduce the FPN which has been the problem in the prior art.

It is to be noted that while the above-described embodiment shows the case in which the LSITs and the CMOSs are fabricated in one chip, the presence and absence of combination, the kinds of other elements to be combined, the constructions of the source, drains and gates of the LSIT are not particularly limited to this embodiment. Also, it is needless to say that it is possible to employ a construction which is opposite in conduction type to the case of FIG. 2 (namely, the semiconductor substrate is N type, the epitaxial layer 3 is P type and the epitaxial layer 8 is N type).

What is claimed is:

1. A lateral static induction transistor assembly comprising at least one lateral static induction transistor, said transistor comprising:
   a semiconductor substrate of a first conduction type of P type or N type;
   a first epitaxial layer of the same conduction type as said first conduction type, which is formed on said semiconductor substrate;
   a second epitaxial layer of a second conduction type opposite to said first conduction type, said second epitaxial layer being formed on said first epitaxial layer along the crystallographic axis of the substrate and being substantially uniform in impurity concentration with said first epitaxial layer;
   a source zone and drain zones formed in said second epitaxial layer near the surface thereof;
   a plurality of gates each thereof being formed so as to partially lie over said source zone and one of said drain zones on said second epitaxial layer through an insulating layer.

2. A lateral static induction transistor assembly according to claim 1, wherein a plurality of said lateral static induction transistors are fabricated in the form of a one-dimensional or two-dimensional array on said semiconductor substrate with said first epitaxial layer being in common to said transistors, and wherein said assembly further comprises isolation means formed in said second epitaxial layer so as to electrically separate an element area of each of said transistors from adjacent areas.

3. A lateral static induction transistor assembly according to claim 1, wherein said semiconductor substrate comprises a semiconductor substrate produced by a CZ method (Czochralski method).

4. A lateral static induction transistor assembly according to claim 1, wherein said first epitaxial layer of P− type is formed on said semiconductor substrate of P type, wherein said second epitaxial layer of N− type is deposited on said first epitaxial layer, wherein said source zone of N+ type and said drain zones of N+ type are formed in said second epitaxial layer of N− type near the surface thereof, and wherein each of said gates is formed on said second epitaxial layer of N− type through said insulating layer between said source and one of said drains so as to partially overlap the same.

5. A lateral static induction transistor assembly according to claim 1, wherein said first epitaxial layer of N− type is formed on said semiconductor substrate of N type, wherein said second epitaxial layer of P− type is deposited on said first epitaxial layer, wherein said source zone of P+ type and said drain zones of P+ type are formed in said second epitaxial layer of P− type near the surface thereof, and wherein each of said gates is formed on said second epitaxial layer of P− type through said insulating layer between said source and one of said drains so as to partially overlap the same.

6. A semiconductor apparatus comprising:
   a semiconductor substrate of a first conduction type of P type or N type;
   a first epitaxial layer of the same conduction type as said first conduction type, which is formed on said semiconductor substrate;
   a second epitaxial layer formed on said first epitaxial layer and being of a second conduction type opposite to said first conduction type; and
   isolation means for electrically dividing said second epitaxial layer on said first epitaxial layer into at least a first and second element section,
   a single lateral static induction transistor element being fabricated in said first element section, said transistor element comprising a first source zone and a plurality of first drain zones which are formed in said second epitaxial layer near the surface thereof, and a plurality of first gate electrodes each thereof being formed so as to partially lie over said first source zone and one of said first drain zones, and
   a CMOS transistor element being fabricated in said second element section, said CMOS transistor element comprising a pair of complementaly MOSFETs including a buried layer formed within said first epitaxial layer throughout the thickness thereof so as to be of the same conduction type as said second conduction type, a first well zone of the same conduction type as said first conduction type and a second well zone of the same conduction type as said second conduction type, said first and second well zones being formed within said second epitaxial layer throughout the thickness thereof on said buried layer, a second source zone and a second drain zone formed in said second well zone near the surface thereof, a third source zone and a third drain zone formed in said second well zone near the surface thereof, a second gate electrode formed so as to lie over said second source zone and said second drain zone on said second epitaxial layer through said insulating layer, and a third gate electrode formed so as to lie over said third source zone and said third drain zone on said second epitaxial layer through said insulating layer.

* * * * *